United States Patent
Nagai et al.

(10) Patent No.: US 7,928,315 B2
(45) Date of Patent: Apr. 19, 2011

(54) TERMINAL BOX FOR A SOLAR CELL PANEL

(75) Inventors: Tsuyoshi Nagai, Osaka (JP); Jun Ishida, Osaka (JP)

(73) Assignee: ONAMBA Co., Ltd., Osaka (JP)

( * ) Notice: Subject to any disclaimer, the term of this patent is extended or adjusted under 35 U.S.C. 154(b) by 716 days.

(21) Appl. No.: 11/666,373

(22) PCT Filed: Oct. 3, 2006

(86) PCT No.: PCT/JP2006/319779
§ 371 (c)(1),
(2), (4) Date: Apr. 25, 2007

(87) PCT Pub. No.: WO2007/060787
PCT Pub. Date: May 31, 2007

(65) Prior Publication Data
US 2009/0139763 A1 Jun. 4, 2009

(30) Foreign Application Priority Data
Nov. 28, 2005 (JP) .................................. 2005-341319

(51) Int. Cl.
*H02N 6/00* (2006.01)

(52) U.S. Cl. ........ 136/244; 136/246; 136/251; 136/252; 136/255; 136/258; 257/54; 257/497

(58) Field of Classification Search ................. 136/244, 136/246, 251, 252, 258, 255; 257/54, 497
See application file for complete search history.

(56) References Cited

U.S. PATENT DOCUMENTS

| 6,225,793 | B1 | 5/2001 | Dickmann |
| 2004/0177987 | A1 | 9/2004 | Yoshikawa et al. |
| 2004/0261836 | A1* | 12/2004 | Kataoka et al. ............... 136/244 |
| 2005/0253142 | A1 | 11/2005 | Negami et al. |

FOREIGN PATENT DOCUMENTS

| DE | 199 16 742 C1 | 8/2000 |
| DE | 102004001011 A1 | 9/2004 |
| DE | 102004036697 A1 | 2/2005 |
| EP | 1 045 455 A2 | 10/2000 |
| JP | 11-017197 | 1/1999 |
| JP | 2000-315808 | 11/2000 |
| JP | 2003-224286 | * 8/2003 |
| JP | 2004-247708 | 9/2004 |
| JP | 2004-319800 | 11/2004 |
| JP | 2005-057008 | 3/2005 |
| JP | 2005-150277 | 6/2005 |

OTHER PUBLICATIONS

Deblasio et al., "Interim Qualification Tests and Procedures for Terrestrial Photovotaic Thin-Film Flat-Plate Modules", Proceedings of the Photovoltaic Specialists Conference, Las Vegas Oct. 7-11, 1991, pp. 796-801.

* cited by examiner

Primary Examiner — Tan N Tran
(74) Attorney, Agent, or Firm — Fish & Richardson P.C.

(57) ABSTRACT

A means for effectively preventing the temperature rise of the diode when the bypass diode is operating in a terminal box for a crystalline silicon solar cell panel is provided. The present invention is characterized in that, in the terminal box for a crystalline silicon solar cell panel, Schottky barrier diode is used as a bypass diode. Preferably, the forward-direction voltage drop of the Schottky barrier diode is the specific value or below at the specific junction temperature. Preferably, as a Schottky barrier diode, a package diode which is surface-mounting type or non-insulation type is used.

4 Claims, 6 Drawing Sheets

TERMINAL BOX FOR A SOLAR CELL PANEL

TECHNICAL FIELD OF THE INVENTION

The present invention relates to a terminal box for a crystalline silicon solar cell panel that can effectively prevent the temperature rise of the diodes and the terminal box by using a Schottky barrier diode as a bypass diode.

BACKGROUND ART

A terminal box for a solar cell panel is typically equipped with a bypass diode for short-circuiting the electric current generated by application of a reverse-direction voltage from one external-connection cable to the other external-connection cable when the electromotive force of the solar cell panel drops. When the by pass diode actually performs this function, a large electric current flows in the forward direction of the diode, so that the diode typically generates heat violently. This raises a possibility that the diode may be broken, or the lifetime of the diode may become considerably short, or the resin constituting the terminal box may be deformed with the heat generated by the diode to let the terminal box drop off from the solar cell panel. In particular, since the terminal box is used as long as twenty years or more in the outside in a state of being mounted on the solar cell panel, the possibility is high. Therefore, in view of the improvement in the long-term safety or reliability, it is demanded to prevent the temperature rise of the by pass diode effectively when the by pass diode is operating.

Conventionally, as means for preventing the temperature rise of the diode effectively, the means is generally adopted that allows the heat generated by the diode to escape to ambient atmosphere by arranging a heat dissipating plate or the like within the terminal box (Japanese Patent Application Laid-Open (JP-A) No. 2005-150277). To sum up, these means are those that aim at restraining the temperature rise of the diode by allowing the generated heat of the diode to be effectively dissipated.

On the other hand, in recent years, in accordance with the demand for increasing the output of the solar cell, a crystalline silicon solar cell is used more often than an amorphous silicon solar cell. However, since the output current of the crystalline silicon solar cell is larger by 30 times or more than that of the amorphous silicon solar cell, the amount of electric current that flows through the diode when the diode is operating, and subsequently the amount of generated heat, are considerably larger for the crystalline silicon solar cell than those of the amorphous silicon solar cell. Therefore, in a terminal box that is used in a crystalline silicon solar cell, one cannot fully restrain the temperature rise of the diode simply by using the conventional general means that merely allows the generated heat of the diode to be dissipated with use of a heat-dissipating plate or the like.

DISCLOSURE OF THE INVENTION

Problem that the Invention is to Solve

The present invention has been devised in view of the current circumstance of such a conventional technique, and an object thereof is to provide a further more effective means for effectively preventing the temperature rise of the diode when the by pass diode is operating (namely, when an abnormality of the solar cell panel occurs) in a terminal box that is used in a crystalline silicon solar cell panel.

Means for Solving the Problem

In order to solve the above-mentioned problems, the present inventors have made eager studies on the means for effectively preventing the temperature rise of the diodes in a terminal box that is used in a crystalline silicon solar cell panel and, as a result of this, have conceived an idea of restraining the heat generation of the diodes themselves instead of the means for allowing the generated heat of the diodes to be dissipated. Then, the present inventors have made further studies on the specific means thereof and have unexpectedly found out that the heat generation of the diodes themselves can be effectively restrained by using Schottky barrier diodes as the diodes and that they can be used without exposing the defects that the Schottky barrier diodes have, thereby completing the present invention.

Namely, the present invention is a terminal box for a crystalline silicon solar cell panel equipped with a bypass diode, characterized in that the aforesaid bypass diode is a Schottky barrier diode. According to a preferable embodiment of the terminal box of the present invention, the aforesaid Schottky barrier diode has a junction temperature guarantee value of 150° C. or above, and the forward-direction voltage drop of the aforesaid Schottky barrier diode when an electric current of 10 A is passed is 0.50 V or below (more preferably 0.45 V or below) at a junction temperature of 25° C., 0.40 V or below (more preferably 0.35 V or below) at a junction temperature of 100° C., and 0.35V or below (more preferably 0.3V or below) at a junction temperature of 150° C. According to another preferable embodiment of the terminal box of the present invention, the terminal box is further equipped with a heat-dissipating plate for allowing the heat generated by the bypass diode to escape and/or an enlarged terminal plate for allowing the heat generated by the bypass diode to escape. According to still another preferable embodiment of the terminal box of the present invention, the Schottky barrier diode is a surface-mounting type or non-insulation type package diode.

Advantages of the Invention

In the terminal box of the present invention, a Schottky barrier diode is used as the bypass diode, so that the heat generation at the time of the operation of the diode can be considerably restrained as compared with a PN diode that has been conventionally used. Also, since the terminal box of the present invention is directed to a crystalline silicon solar cell panel, the defects that the Schottky barrier diode has can be tolerated. Therefore, with the terminal box of the present invention, the temperature rise of the diode and the terminal box at the operation time of the diode can be prevented beforehand. Therefore, there will be no breakage or shortening of the lifetime of the diode, and there will be no drop off of the terminal box from the solar cell panel due to the deformation of the terminal box, whereby the safety and the reliability of the terminal box can be further enhanced.

BEST MODE FOR CARRYING OUT THE INVENTION

The greatest feature of the terminal box for a crystalline silicon solar cell panel of the present invention lies in that a Schottky barrier diode is used as a bypass diode. The Schottky barrier diode (also abbreviated as a Schottky diode) is a diode that utilizes a rectification function of the Schottky effect at the junction plane between a metal and a semiconductor. Because of having a low forward-direction voltage drop (VF), the Schottky barrier diode has a short reverse recovery time, and hence is excellent in the switching property. By utilizing this property, the Schottky barrier diode is generally used conventionally in a power source circuit or a switching power source of an audio apparatus. Also, because of having a low forward-direction voltage drop (VF), the Schottky barrier diode has a property such that the amount of heat generation at the operation time is small. The present invention focuses on this property, and effectively restrains the heat generation itself in the diode at the time of the operation of the diode by using a Schottky barrier diode as a bypass diode of a terminal box for a crystalline silicon solar cell panel.

Figure 1:
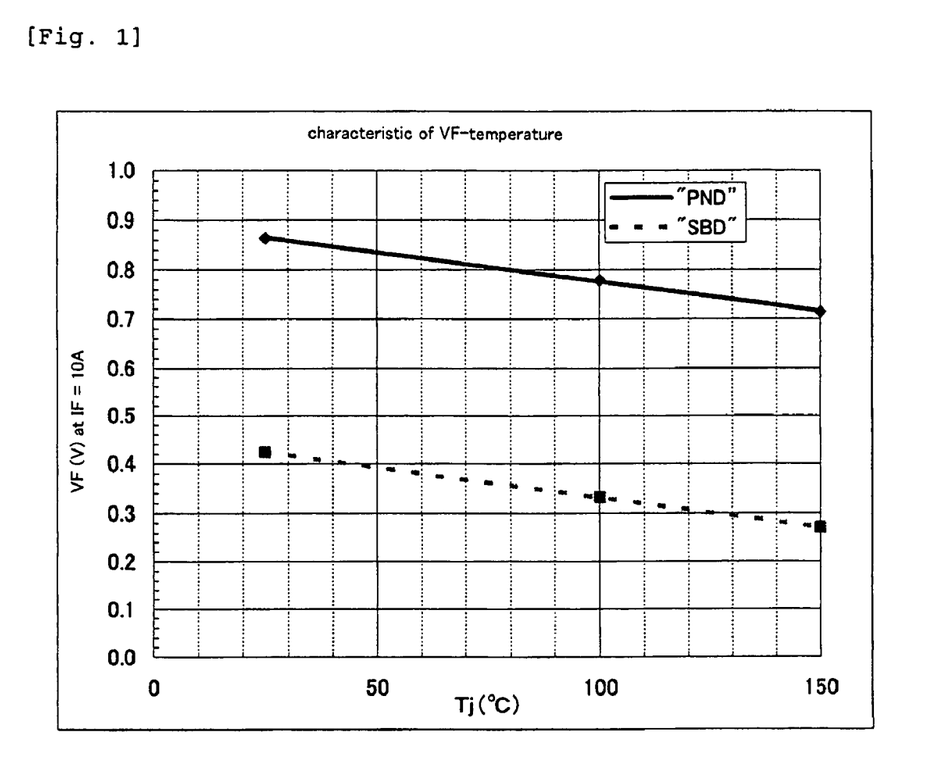
FIG. 1 is a graph showing a relationship between the junction temperature (Tj) and the forward-direction voltage drop (VF) of a PN diode and a Schottky barrier diode.

The following Table 1 is a table in which the representative characteristics (VF (forward-direction voltage drop), VR (reverse-direction breakdown voltage), and IR (leakage current)) of a PN diode (PND) which is a general rectification diode conventionally used in a terminal box for a crystalline silicon solar cell panel and a Schottky barrier diode (SBD) used in the terminal box of the present invention are compared, and FIG. 1 is a graph prepared on the basis of Table 1 and showing a relationship between the junction temperature (Tj) and the forward-direction voltage drop (VF).

TABLE 1

Table for comparing the representative characteristics of PND and SBD

| item | condition | | PND | SBD |
|---|---|---|---|---|
| | IF | Tj | | |
| VF | 10 A | 25° C. | 0.864 V typ | 0.423 V typ |
| | | 100° C. | 0.779 V typ | 0.332 V typ |
| | | 150° C. | 0.714 V typ | 0.270 V typ |
| VR | | | 1200 V typ | 55 V typ |

TABLE 1-continued

Table for comparing the representative characteristics of PND and SBD

| item | condition | | PND | SBD |
|---|---|---|---|---|
| | IF | Tj | | |
| IR | | 25° C. | 0.015 µA typ./40 V | 55 µA typ./40 V |
| | | 100° C. | 1.1 µA typ./40 V | 10 mA typ./40 V |
| | | 150° C. | 20 µA typ./40 V | 160 mA typ./40 V |

PND: PN diode
SBD: Schottky barrier diode
IF: forward-direction current
Tj: junction temperature
VF: forward-direction voltage drop
VR: reverse-direction breakdown voltage
IR: leakage current
typ.: typical value The PN diode shown in Table 1 is a PN diode that has been generally used conventionally in the field of terminal boxes for a solar cell panel, and is a diode that meets the regulation in the terminal boxes for a solar cell panel that the junction guarantee temperature (heat-resistance temperature of the chip part (junction) which is a core of the diode) is 150° C. or above. On the other hand, the Schottky barrier diode (SBD) shown in Table 1 also is a diode that meets the regulation that the junction guarantee temperature is 150° C. or above.

In Table 1, the VF is an index of the heat amount generated by the diode. The smaller the VF is, the smaller the heat amount generated by the diode will be.

The VR means the limit of voltage value such that, when a voltage exceeding this voltage value is applied in the reverse direction of the diode, the essential function of the diode that enables the electric current to flow only in the forward direction is destroyed, and a large amount of the electric current flows in the reverse direction along which no electric current is originally assumed to flow. Therefore, the fact that the VR of a certain diode is small means that the endurance of the diode relative to voltage in the reverse direction is small and that, when this diode is used in a circuit having a possibility that a large voltage may be applied in the reverse direction, a large amount of electric current flows at all times in the reverse direction along which no electric current is originally assumed to flow, thereby leading to decrease in the electrical power generation efficiency or that, in the worst cases, there is a fear that the diode may suffer from thermal runaway to destroy the diode.

The IR means an amount of electric current that flows in the reverse direction when an reverse-direction voltage is applied to the diode. Therefore, the fact that the IR of a certain diode is larger than zero means that this diode cannot shut out the reverse-direction current that the diode should ideally shut out completely when a reverse-direction voltage is applied, thereby leading to decrease in the electrical power generation efficiency or inviting a thermal runaway.

In Table 1, the value of VF (the voltage drop in the forward direction) has been determined by forcibly heating the ambient air of each diode to maintain the junction temperature (Tj) of the diode respectively to be 25° C., 100° C., or 150° C., allowing a forward-direction pulse current of 10 A to flow at a moment to the diode in this state, and measuring the forward-direction voltage drop (VF) at that moment. Also, the value of VR (reverse-direction breakdown voltage) has been determined by applying and increasing the voltage in the reverse direction to each diode, and measuring the reverse-direction voltage at which the electric current has suddenly started to flow. Also, the value of IR (leakage current) has been determined by forcibly heating the ambient air of each diode to maintain the junction temperature (Tj) of the diode respectively to be 25° C., 100° C., or 150° C., in the same manner as in the measurement of the value of VF, allowing a reverse-direction voltage of 40V to be applied at a moment to the diode in this state, and measuring the value of the electric current that flows in the reverse direction at that moment.

As will be understood from the column of the VF (voltage drop in the forward direction) of Table 1 and the graph of FIG. 1, the value of the voltage drop (VF) in the forward direction of the Schottky barrier diode (SBD) is considerably smaller than the value of the voltage drop in the forward direction of the PN diode at any junction temperature (Tj). Specifically, the voltage drop value in the forward direction of the Schottky barrier diode is smaller by about 0.4 V in terms of an average than the voltage drop value in the forward direction of the PN diode, and is as small as about 40% to 50% of the voltage drop value in the forward direction of the PN diode. Here, since the heat amount (w) generated by the diode is equal to a product of the passed electric current amount (IF) and the voltage drop (VF) in the forward direction, the heat amount (w) generated by the diode is proportional to the voltage drop value (VF) in the forward direction if the passed electric current amount (IF) is constant. Thus, the smaller the voltage drop value (VF) in the forward direction is, the smaller the heat amount (W) generated by the diode will be. Therefore, it seems that the heat amount generated by a Schottky barrier diode is considerably smaller than the heat amount generated by a PN diode which is a general rectification diode, and is about 40% to 50% of the heat amount generated by the PN diode. On the other hand, the value of the electric current that flows in the forward direction of a diode when abnormality occurs in a solar cell panel (nominal maximum output operation current) differs greatly depending on the kind of the solar cell panel. In a crystalline silicon solar cell panel, this electric current value is about 9 A while in an amorphous silicon solar cell panel, the electric current value is about 0.3 A. Therefore, the value of the electric current that flows in the forward direction of the diode in a crystalline silicon solar cell panel is larger by 30 times or more than that in an amorphous silicon solar cell panel, so that the problem of heat generation when abnormality occurs in the solar cell panel (namely, when the diode is operating) is more severe in the crystalline silicon solar cell panel. For this reason, use of a Schottky barrier diode having a small VF in a terminal box for a crystalline silicon solar cell panel is extremely advantageous in view of effectively restraining the problem of heat generation of the diode itself when abnormality occurs in the solar cell panel (namely, when the diode is operating).

Here, as will be understood from the column of the VR (breakdown voltage in the reverse direction) of Table 1, the Schottky barrier diode has a considerably smaller VR value than the PN diode. Therefore, the Schottky barrier diode having a small VR value has a defect such that a large amount of electric current may possibly flow in the reverse direction in a normal electrical power-generating state. However, the operation voltage of the nominal maximum output of the panel which is the maximum voltage that can be considered to have a possibility of being applied to the terminal box for the solar cell panel is as low as about 10 to 40 V in a crystalline silicon solar cell panel while it is as high as 100 to 300 V in an amorphous silicon solar cell panel. Thus, this value is surely smaller than the VR (typically about 50 to 100 V) of the Schottky barrier diode. Therefore, even if a Schottky barrier diode is used in a terminal box of a crystalline silicon solar cell panel, there is no possibility that a voltage having a magnitude exceeding the VR is applied to the diode, so that there will not be any problem such that a large amount of electric current may flow at all times in the reverse direction of the diode in a normal electrical power-generating state thereby leading to decrease in the electrical power generation efficiency or such that the diode may suffer from thermal runaway to destroy the diode.

Also, as will be understood from the column of the IR (leakage current) of Table 1, the Schottky barrier diode has a defect such that the value of IR is considerably larger than that of the PN diode. However, in a crystalline silicon solar cell panel, the operation voltage of the maximum output is considerably smaller than that of an amorphous silicon solar cell panel as described above, so that the generated heat amount of the diode caused by leakage current in a normal electrical power-generating state is actually not so large, and the problems of decrease in the electrical power generation efficiency and the temperature rise in the terminal box caused by that are at a sufficiently allowable level.

Particularly, as will be understood from Table 1, the IR of a Schottky barrier diode has an extremely large temperature dependency, and the IR increases exponentially according as the diode temperature rises. Therefore, in a Schottky barrier diode, once the diode temperature rises, the IR increases sharply in accordance therewith, and the sharply increased IR then invites a sharp increase in the generated heat amount, and the sharply increased generated heat amount then invites a further sharp temperature rise. This vicious circle is likely to provoke a so-called thermal runaway such that the diode temperature rises to an extremely high temperature equal to or larger than the heat resistance temperature of the diode thereby eventually destroying the diode. However, as will be understood from Table 1, the IR of the Schottky barrier diode is about 10 mA even at 100° C. which is the maximum use temperature rating of the terminal box for a crystalline silicon solar cell panel. Therefore, the heat amount generated by the Schottky barrier diode is as small as about 0.5 to 1 W even when 50 to 100 V which is the maximum rating voltage (reverse-direction breakdown voltage) of the Schottky barrier diode is applied to the diode, so that the problem of thermal runaway is actually at a sufficiently allowable level.

In the end, in a terminal box for a crystalline silicon solar cell panel, the defect of the Schottky barrier diode having a small VR can be ignored, and the defect of the Schottky barrier diode having a large IR is at a sufficiently allowable level, so that the use of a Schottky barrier diode is comprehensively advantageous.

Conventionally, several examples are known in which a Schottky barrier diode is used as a bypass diode in a solar cell panel; however, no examples have been known in which a Schottky barrier diode is used in a terminal box. This is due to the following reason. When one attempts to use a Schottky barrier diode as a bypass diode in a terminal box, the defect of the Schottky barrier diode such that the reverse-direction breakdown voltage (VR) is small and the leakage current (IR) is large has been considered to be an extremely large hindrance factor because the reverse-direction voltage is high and the heat dissipation property is poor as compared with use of that in a solar cell panel.

Namely, when a bypass diode is used by being incorporated in a solar cell panel, the space for incorporating the bypass diode is sufficiently wide, so that a lot of bypass diodes can be incorporated. Therefore, the number of solar cells that one bypass diode is in charge of can be made small, and the value of the reverse-direction voltage applied to individual bypass diodes can be lowered. In contrast to this, when a bypass diode is used by being incorporated in a terminal box, the volume of the terminal box is usually small, so that the number of bypass diodes that can be incorporated into the terminal box is limited to a small number. Therefore, the number of solar cells that one bypass diode is in charge of is large, and the value of the reverse-direction voltage applied to individual bypass diodes in a normal electrical power-generating state of the solar cell panel is high.

Also, when a bypass diode is used by being incorporated in a solar cell panel, the solar cell panel is excellent in heat-dissipating property because the solar cell panel has an outstandingly larger volume than the terminal box and also has a thin and flat structure. In contrast to this, when a bypass diode is used by being incorporated in a terminal box, the terminal box is inferior in the property (heat dissipating property) of allowing the heat generated when an electric current flows through the bypass diode to escape to the outside, because the terminal box usually has a small volume and also is tightly closed.

The problem of high reverse-direction voltage or poor heat-dissipating property in the case of using a bypass diode by incorporating it in a terminal box does not particularly constitute a hindrance factor when a conventional PN diode having a large VR and a small IR is adopted as a bypass diode to be used in the terminal box. However, when a Schottky barrier diode having a small VR and a large IR is adopted, this will be an extremely large hindrance factor. In particular, with respect to IR, the IR of the Schottky barrier diode increases exponentially according as the temperature rises, as described above, so that the danger of the diode provoking thermal runaway has been strongly feared.

For this reason, it has been a conventional common sense in the relevant field of the art that a Schottky barrier diode can be used in a solar cell panel but it cannot be used within a terminal box.

This is also clear from the following facts. Namely, referring to diodes for rectification among the diodes, there are only two kinds, namely PN diodes and Schottky barrier diodes. Here, since it has been known to those skilled in the art that a Schottky barrier diode has a smaller generated heat amount (VF) than a PN diode, it might seem natural if there were an example in which a Schottky barrier diode is used instead of a PN diode in a terminal box. Nevertheless, no examples have been present up to now in which a Schottky barrier diode is used in a terminal box for a solar cell panel, and only an example of use in a solar cell panel is found out. Such a fact strongly tells us that the defects of the Schottky barrier diode having a small reverse-direction breakdown voltage (VR) or having a large leakage current (IR) have been a greater matter of concern (hindrance factor) to those skilled in the art than the advantage of the Schottky barrier diode having a small generated heat amount (VF), that these defects will be a non-ignorable great problem when the Schottky barrier diode is to be used in a terminal box though these do not raise a problem when the Schottky barrier diode is to be used in a solar cell panel and, for this reason, it has been a conventional technical common sense common to those skilled in the art that the Schottky barrier diode cannot be used in a terminal box.

The present inventors have found out that such a conventional technical common sense of those skilled in the art merely regarded that Schottky barrier diodes unanimously cannot be used in a terminal box for a solar cell panel without considering the kind of the solar cell panel. Then, the present inventors have made further researches and found out that the defect of the Schottky barrier diode can be ignored (in terms of the smallness of VR) or is at a sufficiently allowable level (in terms of the largeness of IR), and the advantage of the Schottky barrier diode having a small VF can be utilized alone, because the crystalline silicon solar cell panel among the solar cell panels has a larger nominal maximum output operation current and a smaller nominal maximum output operation voltage as compared with the amorphous silicon solar cell panel, thereby completing the present invention.

As a Schottky barrier diode to be used in the terminal box of the present invention, any of the Schottky barrier diodes having a small forward-direction voltage drop value and having a small heat amount generated by the diode can be used. However, in order to prevent with certainty the temperature rise of the diode at the time of operation of the diode in an actual environment of use, it is preferable to use a Schottky barrier diode having a junction temperature guarantee value of 150° C. or above and in which the forward-direction voltage drop (VF) of the Schottky barrier diode when an electric current of 10 A is passed is 0.50 V or below at a junction temperature of 25° C., 0.40 V or below at a junction temperature of 100° C., and 0.35 V or below at a junction temperature of 150° C. More preferably, one uses a Schottky barrier diode having a junction temperature guarantee value of 150° C. or above and in which the forward-direction voltage drop (VF) of the Schottky barrier diode when an electric current of 10 A is passed is 0.45 V or below at a junction temperature of 25° C., 0.35 V or below at a junction temperature of 100° C., and 0.30 V or below at a junction temperature of 150° C. Here, the above-described forward-direction voltage drop at each junction temperature has been measured by the procedure described above in relation to Table 1.

Among the above regulation, the junction temperature guarantee value means the heat resistance temperature of the diode. Namely, the junction temperature guarantee value represents that the diode will not be destroyed up to this temperature. Here, the reason why the junction temperature guarantee value of the Schottky barrier diode preferably used in the terminal box of the present invention is limited to 150° C. or above is that a general junction temperature guarantee value demanded in the industry with regard to the diodes in the terminal box for a solar cell panel used in the country of Japan is 150° C.

Also, the reason why the electric current passage condition for the forward-direction voltage drop (VF) of the diode is set to be 10 A is that it is set to be 10 A so as to have allowance because the maximum output current of a crystalline silicon solar cell is about 9 A.

Also, the reason why the VF is defined at three kinds of the junction temperatures of 25° C., 100° C., and 150° C. is for reflecting the following actual environments of use, respectively. Namely, 25° C. represents the use at an ordinary temperature; 100° C. represents the use at the upper limit of the temperature for use of a general solar cell panel (rating temperature) (this temperature is actually 90° C.; however, it is set to be 100° C. so as to have allowance); and 150° C. represents the use at a general junction temperature guarantee value that is demanded in the industry with respect to the diodes in the terminal box for a solar cell panel used in the country of Japan.

The VF of the Schottky barrier diode used in the terminal box of the present invention is preferably not higher than a predetermined value at each of the above-described junction temperatures. This is because when the VF exceeds these values, the heat amount generated by the Schottky barrier diode when abnormality of the solar cell panel occurs (namely, when the diode is operating) will be large, and the advantage of using the Schottky barrier diode will be small.

The Schottky barrier diode satisfying the requirement such as described above can be suitably selected from among the commercially available Schottky barrier diodes having various junction temperature guarantee values and VF characteristics. For example, the present inventors examined the VF characteristics at each temperature when an electric current of 10 A is passed with respect to three kinds of Schottky barrier diodes that are referred to as the 55V rating type (those having a reverse-direction breakdown voltage of 55v), the 55V rating low-leakage type (those having a reverse-direction breakdown voltage of 55V and having a small leakage current), and the 100V rating type (those having a reverse-direction breakdown voltage of 100V) among the commercially available Schottky barrier diodes having a junction temperature guarantee value of 150° C. or above, whereby the data such as shown in the following Table 2 have been obtained.

TABLE 2

Comparison of the VF characteristics of the commercially available three kinds of Schottky barrier diodes

| item | condition | | 55 V rating type | 55 V rating low-leakage type | 100 V rating type |
| --- | --- | --- | --- | --- | --- |
| | IF | Tj | | | |
| VF | 10 A | 25° C. | 0.423 V typ | 0.467 V typ | 0.762 V typ |
| | | 100° C. | 0.332 V typ | 0.386 V typ | 0.661 V typ |
| | | 150° C. | 0.270 V typ | 0.332 V typ | 0.583 V typ |

As will be understood from Table 2, the 100V rating type does not satisfy the requirement such that the VF at 25° C. is 0.50V or below, the VF at 100° C. is 0.40V or below, and the VF at 150° C. is 0.35V or below; however, the 55V rating low-leakage type and the 55V rating type satisfy this requirement. Also, the 55V rating type satisfies also a requirement severer by one step such that the VF at 25° C. is 0.45V or below, the VF at 100° C. is 0.35V or below, and the VF at 150° C. is 0.30V or below. Therefore, as the Schottky barrier diode to be used in the terminal box of the present invention, the 55V rating low-leakage type and the 55V rating type are more preferable than the 100V rating type among these three kinds of Schottky barrier diodes, and further the 55V rating type is the most preferable.

As described above, in the case of using a Schottky barrier diode in a terminal box for a crystalline silicon solar cell panel, one defect of the Schottky barrier diode having a small VR can be ignored, but the other defect of the Schottky barrier diode having a large IR cannot be completely ignored and stays at an allowable level. However, the present inventors have found out that, by devising a structure of the terminal box or a kind of the Schottky barrier diode, the other defect of the Schottky barrier diode having a large IR can be restrained to be at an ignorable level as well.

Namely, as will be understood from Table 1, the value of leakage current changes in accordance with the temperature and, according as the temperature rises, the value of leakage current increases. Therefore, when the heat generated by the Schottky barrier diode is allowed to escape to the surroundings to lower the temperature of the diode by devising a structure of the terminal box or a kind of the Schottky barrier diode, the value of leakage current can be further restrained to be low, whereby decrease in the electrical power generation efficiency at the time of normal electrical power generation and the temperature rise of the terminal box can be effectively prevented.

As a structure of the terminal box that is effective for this purpose, one can consider, for example, providing the terminal box with a heat-dissipating plate for allowing the heat generated by the diode to escape or enlarging the terminal plate for allowing the heat generated by the diode to escape to be planarly larger than the usual dimension.

Figure 2:
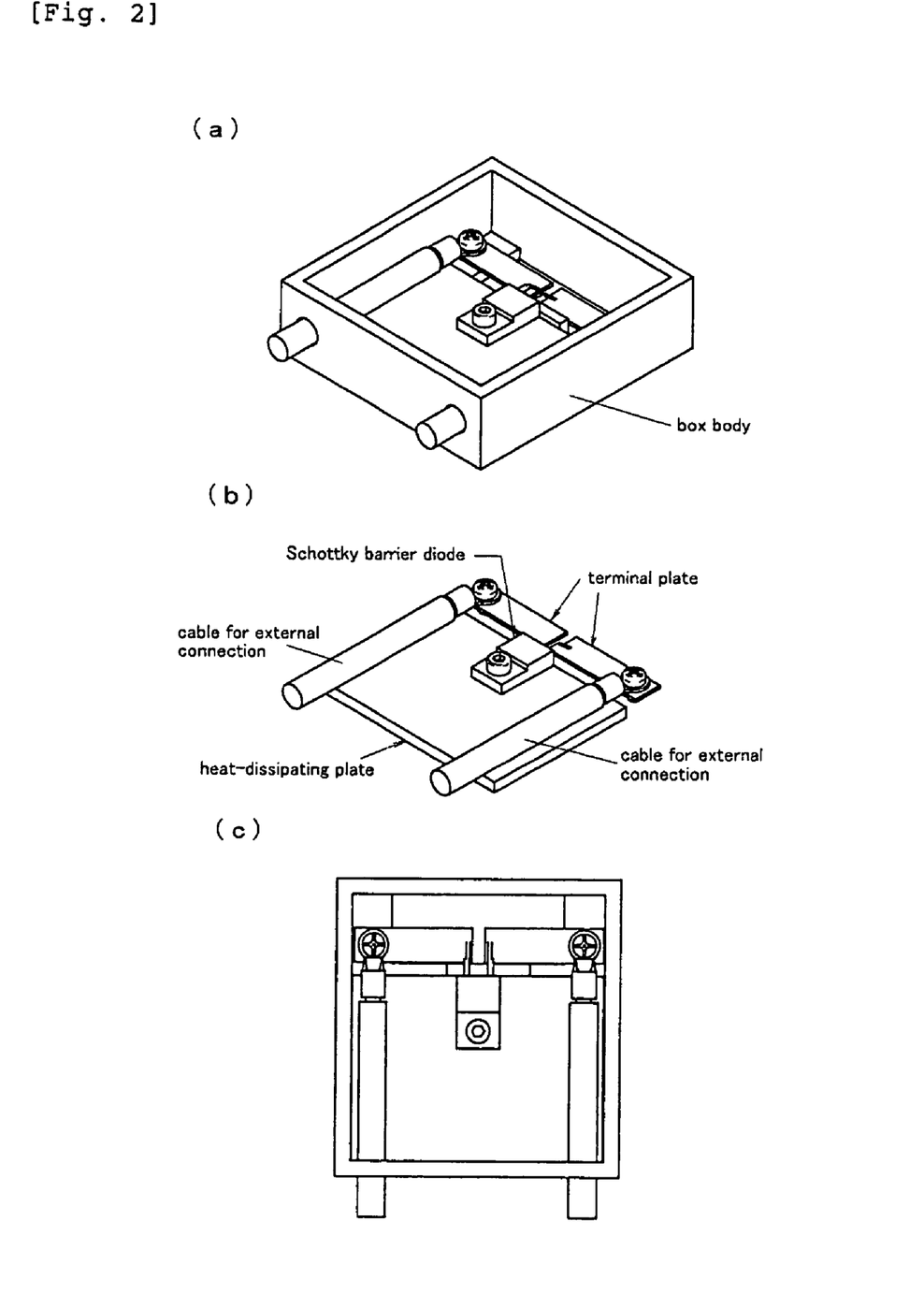
FIG. 2 shows one example of a terminal box of the present invention equipped with a heat-dissipating plate.
Figure 3:
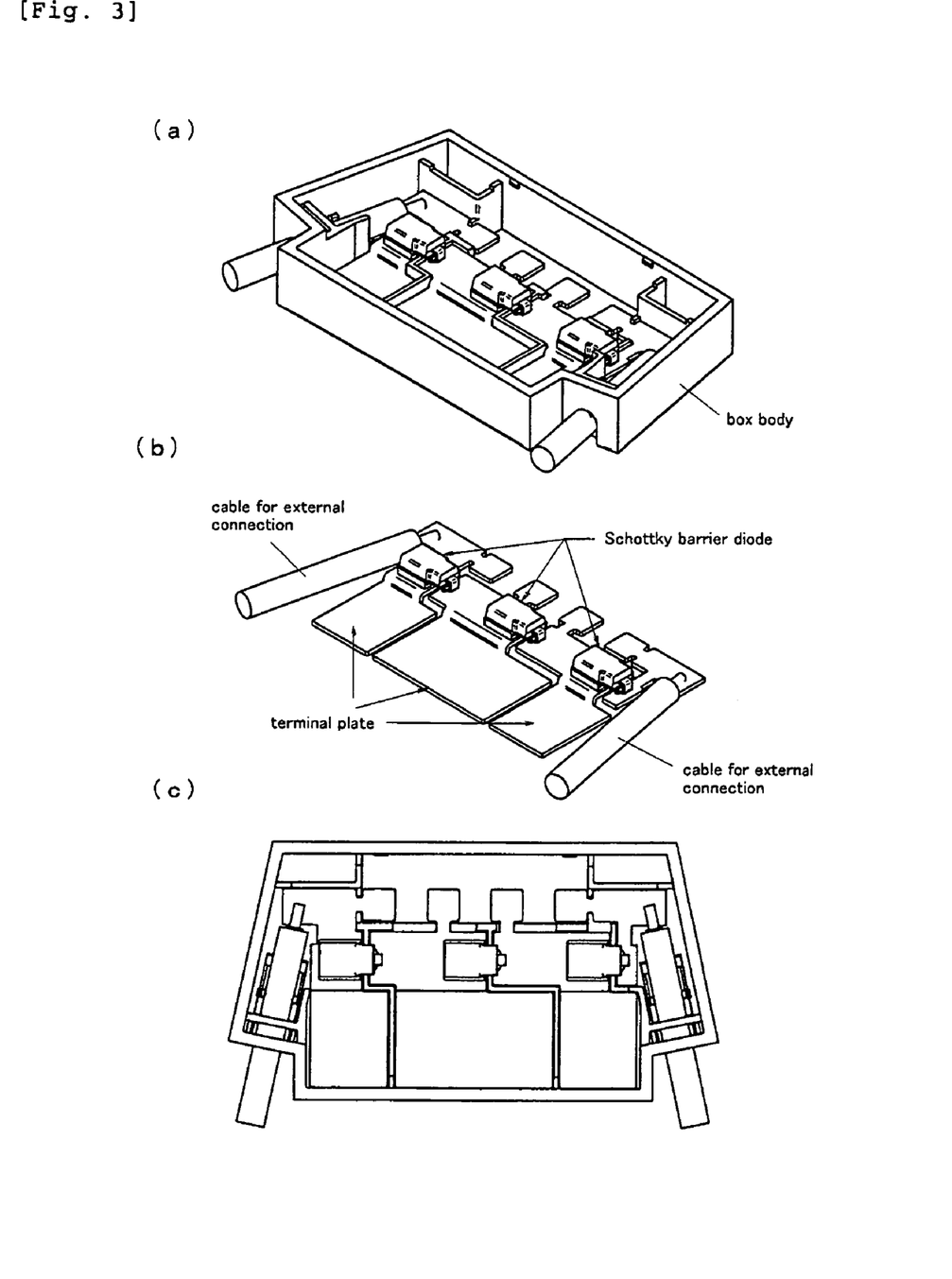
FIG. 3 shows another example of a terminal box of the present invention equipped with an enlarged terminal plate.

We consider that the concrete construction of the heat-dissipating plate and the enlarged terminal plate as well as the arrangement thereof within the terminal box are fully known to those skilled in the art; however, they can be, for example, those shown in FIG. 2 or FIG. 3. FIG. 2 shows one example of the terminal box of the present invention equipped with a heat-dissipating plate. In FIG. 2, (a) is a perspective view of the terminal box from which the lid part has been removed; (b) is a perspective view of the inside of the terminal box from which the box body has been removed; and (c) is a plan view obtained by viewing from directly above. In the terminal box of FIG. 2, one Schottky barrier diode electrically connects one pair of terminal plates with each other, and functions as a bypass diode. One end of each terminal plate is connected to an electrode (not illustrated) that has been drawn out from the solar cell panel, and the other end is connected to a cable for external connection. Via these cables, adjacent solar cell panels are electrically connected. In the terminal box of FIG. 2, a heat-dissipating plate made of a thin plate such as a metal having a high heat conductivity is arranged under the Schottky barrier diode so as to be in thermal contact with the bottom surface of the diode, and allows the heat generated by the diode to escape via the heat-dissipating plate.

FIG. 3 shows another example of the terminal box of the present invention equipped with an enlarged terminal plate. In FIG. 3, (a) is a perspective view of the terminal box from which the lid part has been removed; (b) is a perspective view of the inside of the terminal box from which the box body has been removed; and (c) is a plan view obtained by viewing from directly above. In the terminal box of FIG. 3, three Schottky barrier diodes are used to electrically connect two pairs of (four sheets of) terminal plates respectively with each other, and function as bypass diodes. In the two sheets of terminal plates on the both ends (located on the outer sides) among the four sheets of terminal plates, one end is connected to the electrode (not illustrated) that has been drawn out from the solar cell panel, and the other end is connected to the cable for external connection. Also, the two sheets of terminal plates on the inner sides are connected to the electrode (not illustrated) that has been drawn out from the solar cell panel. In the terminal box of FIG. 3, among the four sheets of terminal plates, the three sheets of terminal plates excluding the terminal plate on the right end are enlarged to be planarly larger than the usual dimension, so as to allow the heat generated by the diodes to escape via these enlarged terminal plates.

Also, the kind of Schottky barrier diode that is effective in lowering the temperature of the diode by allowing the heat generated by the Schottky barrier diode to escape to the surroundings can include, for example, a surface-mounting type or non-insulation type package diode.

Figure 4:
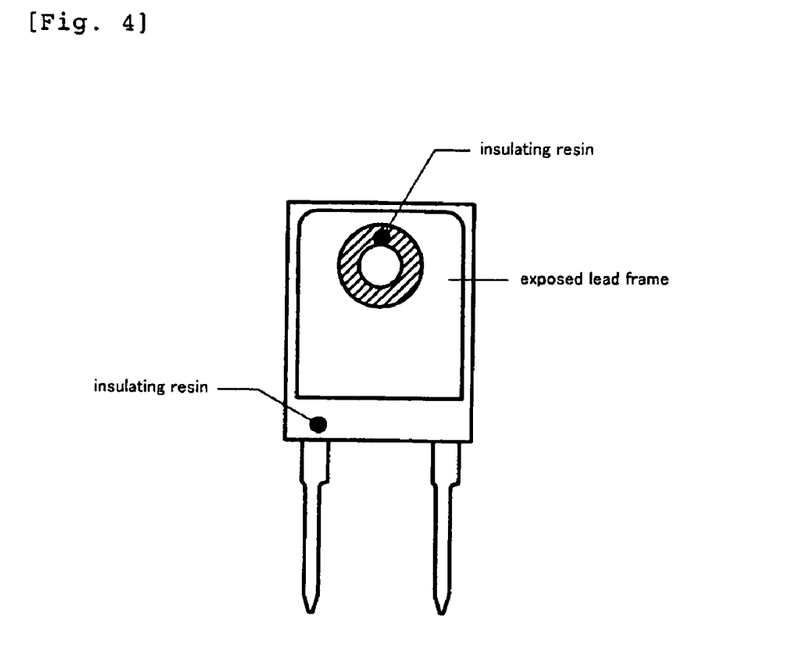
FIG. 4 shows a bottom surface structure of a surface-mounting type or non-insulation type package diode.

A surface-mounting type or non-insulation type package diode has a part that is not covered with insulating resin on the bottom surface of the lead frame of the diode, as shown in FIG. 4. Therefore, by using a surface-mounting type or non-insulation type Schottky barrier diode, the heat generated by the diode can be efficiently allowed to escape from this part to the surroundings. More specifically, by allowing the part that is not covered with insulating resin on the bottom surface of the surface-mounting type or non-insulation type package diode to be brought into contact and fixed to the terminal plate or the heat-dissipating plate of the terminal box by soldering or by fixation with a screw or the like through the intermediary of thermally conductive grease, the heat generated by the Schottky barrier diode can be allowed to escape effectively to the terminal plate or the heat-dissipating plate via the bottom surface of the diode.

Therefore, by allowing the terminal box to be further equipped with a heat-dissipating plate or an enlarged terminal plate, or by using a surface-mounting type or non-insulation type package diode as a Schottky barrier diode, the temperature of the diode can be lowered, and the value of leakage current can be further lowered to be restrained to be at a level such that the problems of decrease in the electrical power generation efficiency at the time of electrical power generation and temperature rise of the terminal box can be completely ignored.

EXAMPLES

Hereafter, the effect of prevention of the temperature rise of the diode and the terminal box by the terminal box for a solar cell panel of the present invention will be specifically shown; however, the present invention is not limited to this alone.

In order to show the effect of prevention of the temperature rise of the diode and the terminal box under an actual condition of use of the terminal box for a solar cell panel of the present invention, a model experiment was conducted according to the following measurement procedure with use of the following test samples.

Preparation of Test Samples (1) Example 1

Figure 5:
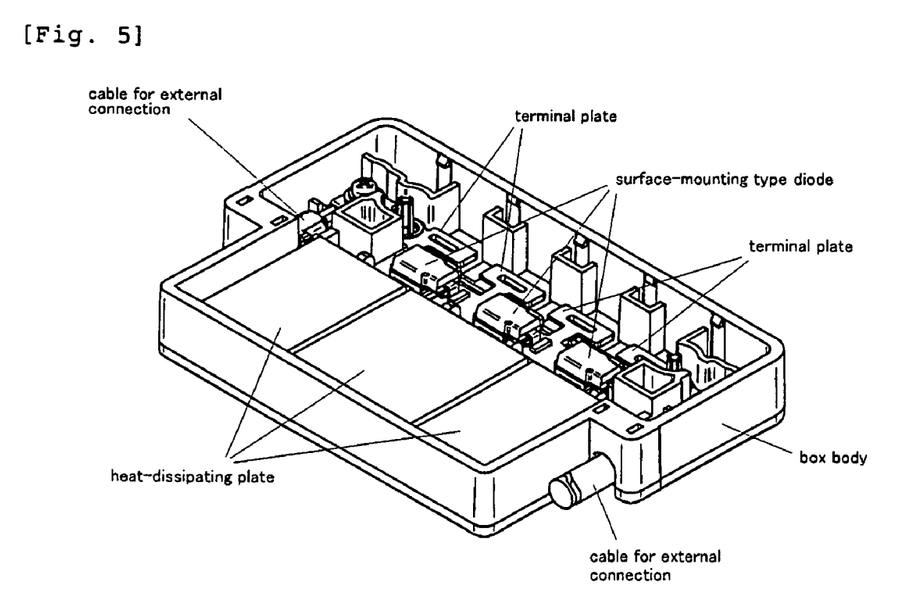
FIG. 5 shows a structure of a test sample used in the Examples.

As a bypass diode, a Schottky barrier diode of 55V rating type shown in Table 2 was used to prepare a test sample having a structure as shown in FIG. 5. In the test sample of FIG. 5, two pairs of (four sheets of) terminal plates are placed in the inside of a box body made of resin, and three surface-mounting type Schottky barrier diodes are electrically connected thereto. Among the four sheets of terminal plates, the three sheets of terminal plates excluding the terminal plate on the right end are enlarged to be planarly larger than the usual dimension (See also the plan view of the inside of the box body shown in FIG. 6 for reference). In addition, three sheets of heat-dissipating plates are respectively mounted on the enlarged terminal plates.

(2) Example 2

A test sample was prepared in the same manner as in the Example 1 except that the diode was changed to a 55V rating low-leakage type Schottky barrier diode shown in Table 2 in the test sample shown in FIG. 5.

(3) Example 3

A test sample was prepared in the same manner as in the Example 1 except that the diode was changed to a 100V rating type Schottky barrier diode shown in Table 2 in the test sample shown in FIG. 5.

(4) Comparative Example

A test sample was prepared in the same manner as in the Example 1 except that the diode was changed to a PN diode shown in Table 1 in the test sample shown in FIG. 5.

Measurement Procedure

Figure 6:
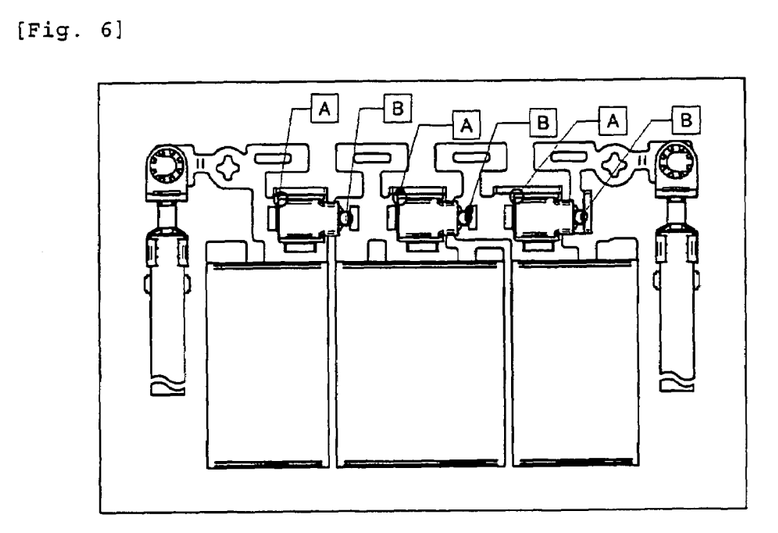
FIG. 6 shows an inside of the box body of the test sample of FIG. 5.

For measurement of the actually measured value of the diode temperature, a thermocouple was attached to the position shown by A in FIG. 6 (the part that is considered to generate the largest amount of heat among the exposed metal parts of the surface-mounting type diode) of the test samples of the Examples 1 to 3 and the test sample of the Comparative Example. Also, for measurement of the voltage drop value in the forward direction, a lead wire was respectively attached to the position shown by A and B (the part that has an electric polarity opposite to that of A among the exposed metal parts of the surface-mounting type diode) in FIG. 6 of the test samples of the Examples 1 to 3 and the test sample of the Comparative Example, so as to enable measurement of the voltage between A-B. Also, for measurement of the actually measured value of the temperature of the bottom surface part of the terminal box, a thermocouple was attached to the part of the terminal box located directly under the diode.

Next, silicone grease was applied to the back surface of the test samples of the Examples 1 to 3 and the test sample of the Comparative Example, and a glass panel was bonded to prepare a solar cell module.

Next, this solar cell module was placed by being suspended in a thermostatic chamber of 75° C. atmosphere so that the module might not be in contact with the inner surface of the thermostatic chamber. Here, this temperature of 75° C. is a temperature that is defined in the standard of heat resistance temperature measurement of a terminal box for a solar cell panel, and is assumed to be the maximum temperature that can be attained under an actual circumstance of use of the terminal box for a solar cell panel.

Next, with a constant-current power source, a direct electric current of 6.0 A, 8.8 A, or 11.0 A was passed through each test sample for one hour in the forward direction, and the actually measured value of the temperature of the diode, the voltage drop in the forward direction, and the actually measured value of the temperature of the bottom surface part of the terminal box after one hour were respectively measured. Here, the passed electric current amount of 6.0 A corresponds to the general maximum output operation current value of a small-size crystalline silicon solar cell panel; the passed electric current amount of 8.8 A corresponds to the general maximum output operation current value of a current ordinary-size crystalline silicon solar cell panel; and the passed electric current amount of 11.0 A corresponds to the test value on the standard that is required to be used in a temperature test of a terminal box for a solar cell panel (the value with an allowance of 25% from 8.8 A).

Also, the junction temperature (Tj) was inferred from the actually measured value of the temperature of the diode. This inference was calculated in accordance with the following formula assuming that the heat resistance value between the junction (heat generating part) of each diode and the position of actual measurement of the diode temperature was 0.5° C., and that the product of the generated heat amount of each diode and the above-mentioned heat resistance value was the temperature that was lost from the heat generating part up to the position of actual measurement of the temperature.

Inferred junction temperature(inferred $Tj$)=(actually measured value of the diode temperature)+0.5×(amount of heat generated by the diode)

Here, the amount of heat generated by the diode is the product of the passed electric current amount and the voltage drop value (VF) in the forward direction.

The result of these measurements and the result of calculation on the terminal boxes of the Example 1 to 3 and the Comparative Example will be shown in the following Table 3 (part 1) to Table 3 (part 4).

TABLE 3

| | | | position of diode | | | |
|---|---|---|---|---|---|---|
| | | | left end | center | right end | average or total |
| | | (part 1) The result of VF-temperature measurement on Example 1 (55 V rating type Schottky barrier diode) | | | | |
| passed electric current amount in the forward-direction (IF) | 6.0 A | voltage drop value (VF) in the forward direction | 0.2696 V | 0.2697 V | 0.2708 V | 0.2700 V (average) |
| | | amount of heat generated by the diode | 1.62 W | 1.62 W | 1.62 W | 4.86 W (total) |
| | | actually measured value of the diode temperature | 98.0° C. | 98.3° C. | 97.5° C. | 97.9° C. (average) |
| | | inferred junction temperature (inferred Tj) | 98.8° C. | 99.1° C. | 98.3° C. | 98.7° C. (average) |
| | | actually measured value of the terminal box bottom surface temperature (Tc) | 88.3° C. | 89.4° C. | 88.4° C. | 88.7° C. (average) |
| | 8.8 A | voltage drop value (VF) in the forward direction | 0.2755 V | 0.2747 V | 0.2771 V | 0.2758 V (average) |
| | | amount of heat generated by the diode | 2.42 W | 2.42 W | 2.44 W | 7.28 W (total) |
| | | actually measured value of the diode temperature | 112.2° C. | 112.5° C. | 110.5° C. | 111.7° C. (average) |
| | | inferred junction temperature (inferred Tj) | 113.4° C. | 113.7° C. | 111.7° C. | 112.9° C. (average) |
| | | actually measured value of the terminal box bottom surface temperature (Tc) | 96.0° C. | 98.0° C. | 95.4° C. | 96.5° C. (average) |
| | 11.0 A | voltage drop value (VF) in the forward direction | 0.2808 V | 0.2791 V | 0.2821 V | 0.2807 V (average) |
| | | amount of heat generated by the diode | 3.09 W | 3.07 W | 3.10 W | 9.26 W (total) |
| | | actually measured value of the diode temperature | 121.9° C. | 122.3° C. | 119.9° C. | 121.4° C. (average) |
| | | inferred junction temperature (inferred Tj) | 123.4° C. | 123.8° C. | 121.5° C. | 122.9° C. (average) |
| | | actually measured value of the terminal box bottom surface temperature (Tc) | 101.7° C. | 105.0° C. | 100.8° C. | 102.5° C. (average) |
| | | (part 2) The result of VF-temperature measurement on Example 2 (55 V rating low-leakage type Schottky barrier diode) | | | | |
| passed electric current amount in the forward-direction (IF) | 6.0 A | voltage drop value (VF) in the forward direction | 0.3027 V | 0.3020 V | 0.3036 V | 0.3028 V (average) |
| | | amount of heat generated by the diode | 1.82 W | 1.81 W | 1.82 W | 5.45 W (total) |
| | | actually measured value of the diode temperature | 100.4° C. | 100.9° C. | 99.8° C. | 100.4° C. (average) |
| | | inferred junction temperature (inferred Tj) | 101.3° C. | 101.8° C. | 100.7° C. | 101.3° C. (average) |
| | | actually measured value of the terminal box bottom surface temperature (Tc) | 90.7° C. | 91.2° C. | 90.2° C. | 90.7° C. (average) |
| | 8.8 A | voltage drop value (VF) in the forward direction | 0.3246 V | 0.3235 V | 0.3279 V | 0.3253 V (average) |
| | | amount of heat generated by the diode | 2.86 W | 2.85 W | 2.89 W | 8.59 W (total) |
| | | actually measured value of the diode temperature | 118.1° C. | 118.8° C. | 115.8° C. | 117.5° C. (average) |
| | | inferred junction temperature (inferred Tj) | 119.5° C. | 120.2° C. | 117.2° C. | 119.0° C. (average) |
| | | actually measured value of the terminal box bottom surface temperature (Tc) | 102.7° C. | 104.0° C. | 101.4° C. | 102.7° C. (average) |
| | 11.0 A | voltage drop value (VF) in the forward direction | 0.3531 V | 0.3511 V | 0.3579 V | 0.3540 V (average) |
| | | amount of heat generated by the diode | 3.88 W | 3.86 W | 3.94 W | 11.68 W (total) |
| | | actually measured value of the diode temperature | 132.9° C. | 134.1° C. | 129.5° C. | 132.2° C. (average) |
| | | inferred junction temperature (inferred Tj) | 134.8° C. | 136.0° C. | 131.5° C. | 134.1° C. (average) |
| | | actually measured value of the terminal box bottom surface temperature (Tc) | 113.0° C. | 114.9° C. | 109.2° C. | 112.4° C. (average) |

TABLE 3-continued

|  |  |  | position of diode | | | average or total |
|---|---|---|---|---|---|---|
|  |  |  | left end | center | right end |  |
|  | (part 3) The result of VF-temperature measurement on Example 3 (100 V rating type Schottky barrier diode) | | | | | |
| passed electric current amount in the forward-direction (IF) | 6.0 A | voltage drop value (VF) in the forward direction | 0.6151 V | 0.6092 V | 0.6162 V | 0.6135 V (average) |
|  |  | amount of heat generated by the diode | 3.69 W | 3.66 W | 3.70 W | 11.04 W (total) |
|  |  | actually measured value of the diode temperature | 124.0° C. | 126.3° C. | 123.7° C. | 124.6° C. (average) |
|  |  | inferred junction temperature (inferred Tj) | 125.8° C. | 128.1° C. | 125.5° C. | 126.5° C. (average) |
|  |  | actually measured value of the terminal box bottom surface temperature (Tc) | 108.5° C. | 111.1° C. | 108.9° C. | 109.5° C. (average) |
|  | 8.8 A | voltage drop value (VF) in the forward direction | 0.5726 V | 0.5651 V | 0.5720 V | 0.5699 V (average) |
|  |  | amount of heat generated by the diode | 5.04 W | 4.97 W | 5.03 W | 15.04 W (total) |
|  |  | actually measured value of the diode temperature | 143.1° C. | 146.6° C. | 143.6° C. | 144.4° C. (average) |
|  |  | inferred junction temperature (inferred Tj) | 145.6° C. | 149.1° C. | 146.1° C. | 146.9° C. (average) |
|  |  | actually measured value of the terminal box bottom surface temperature (Tc) | 118.9° C. | 119.9° C. | 119.6° C. | 119.5° C. (average) |
|  | 11.0 A | voltage drop value (VF) in the forward direction | 0.5340 V | 0.5233 V | 0.5311 V | 0.5295 V (average) |
|  |  | amount of heat generated by the diode | 5.87 W | 5.76 W | 5.84 W | 17.47 W (total) |
|  |  | actually measured value of the diode temperature | 156.3° C. | 162.0° C. | 158.1° C. | 158.8° C. (average) |
|  |  | inferred junction temperature (inferred Tj) | 159.2° C. | 164.9° C. | 161.0° C. | 161.7° C. (average) |
|  |  | actually measured value of the terminal box bottom surface temperature (Tc) | 125.8° C. | 130.5° C. | 127.7° C. | 128.0° C. (average) |
|  | (part 4) The result of VF-temperature measurement on Comparative Example (PN diode) | | | | | |
| passed electric current amount in the forward-direction (IF) | 6.0 A | voltage drop value (VF) in the forward direction | 0.6992 V | 0.6956 V | 0.6983 V | 0.6977 V (average) |
|  |  | amount of heat generated by the diode | 4.20 W | 4.17 W | 4.19 W | 12.56 W (total) |
|  |  | actually measured value of the diode temperature | 129.8° C. | 132.3° C. | 130.1° C. | 130.7° C. (average) |
|  |  | inferred junction temperature (inferred Tj) | 131.9° C. | 134.4° C. | 132.2° C. | 132.8° C. (average) |
|  |  | actually measured value of the terminal box bottom surface temperature (Tc) | 111.1° C. | 112.9° C. | 110.1° C. | 111.4° C. (average) |
|  | 8.8 A | voltage drop value (VF) in the forward direction | 0.6849 V | 0.6796 V | 0.6837 V | 0.6827 V (average) |
|  |  | amount of heat generated by the diode | 6.03 W | 5.98 W | 6.02 W | 18.02 W (total) |
|  |  | actually measured value of the diode temperature | 155.0° C. | 159.2° C. | 156.0° C. | 156.7° C. (average) |
|  |  | inferred junction temperature (inferred Tj) | 158.0° C. | 162.2° C. | 159.0° C. | 159.7° C. (average) |
|  |  | actually measured value of the terminal box bottom surface temperature (Tc) | 123.6° C. | 132.5° C. | 124.3° C. | 126.8° C. (average) |
|  | 11.0 A | voltage drop value (VF) in the forward direction | 0.6694 V | 0.6617 V | 0.6681 V | 0.6664 V (average) |
|  |  | amount of heat generated by the diode | 7.36 W | 7.28 W | 7.35 W | 21.99 W (total) |
|  |  | actually measured value of the diode temperature | 175.7° C. | 182.0° C. | 177.2° C. | 178.3° C. (average) |
|  |  | inferred junction temperature (inferred Tj) | 179.4° C. | 185.6° C. | 180.9° C. | 182.0° C. (average) |
|  |  | actually measured value of the terminal box bottom surface temperature (Tc) | 134.0° C. | 142.2° C. | 133.7° C. | 136.6° C. (average) |

Figure 7:
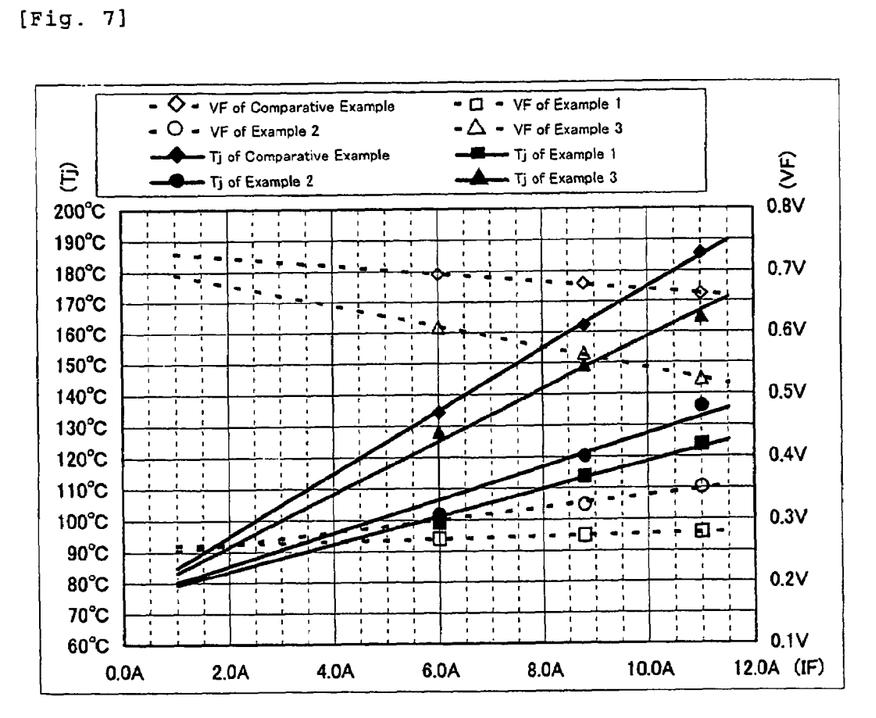
FIG. 7 is a graph showing a relationship between the forward-direction current (IF) and the forward-direction voltage drop (VF) or junction temperature (Tj) of the Examples 1 to 3 of the present invention and the Comparative Example.
Figure 8:
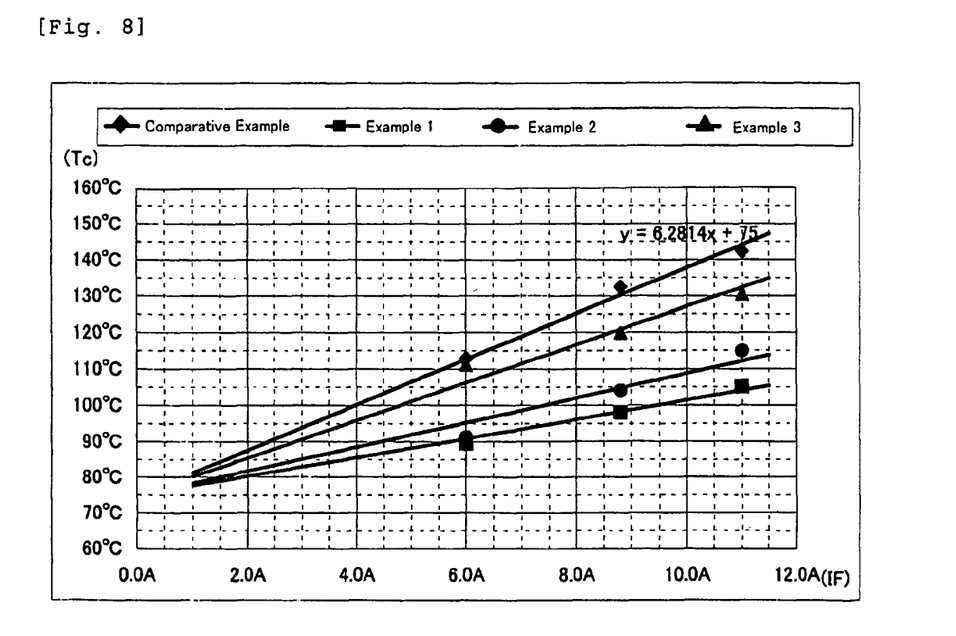
FIG. 8 is a graph showing a relationship between the forward-direction current (IF) and the terminal box bottom surface temperature (Tc) of the Examples 1 to 3 of the present invention and the Comparative Example.
Figure 9:
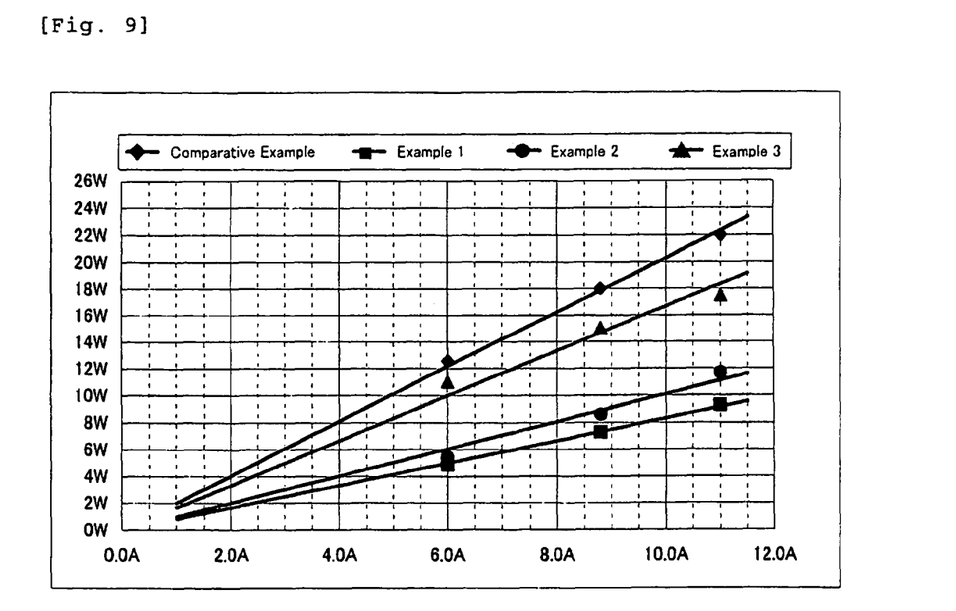
FIG. 9 is a graph showing a relationship between the forward-direction current (IF) and the total generated heat amount of the three diodes within the terminal box of the Examples 1 to 3 of the present invention and the Comparative Example.

Also, based on the maximum value of the data of Table 3 (part 1) to Table 3 (part 4), FIGS. 7-9 were prepared. FIG. 7 shows a graph showing a relationship between the forward-direction current (IF) and the forward-direction voltage drop (VF) or junction temperature (Tj); FIG. 8 shows a graph showing a relationship between the forward-direction current (IF) and the terminal box bottom surface temperature (Tc); and FIG. 9 shows a graph showing a relationship between the forward-direction current (IF) and the total generated heat amount of the three diodes within the terminal box.

As will be understood from Table 3 (part 1), Table 3 (part 4), and FIG. 7, the forward-direction voltage drop value (VF) of the terminal box of the Example 1 using a 55V rating type Schottky barrier diode was considerably smaller than the VF of the terminal box of the Comparative Example using a PN diode at any amount of the passed electric current, and was smaller by about 0.4V in an average. Since the VF is small in this manner, the generated heat amount which is a product of VF and IF of the terminal box of the Example 1 was considerably smaller than that of the terminal box of the Comparative Example, as shown in FIG. 9, and was about 40% of the generated heat amount of the terminal box of the Comparative Example in an average. In particular, the difference of the generated heat amount became much larger according as the passed electric amount (IF) increased. The junction temperature (Tj) of the diode and the bottom surface temperature (Tc) of the terminal box also showed a tendency similar to that of the generated heat amount (FIG. 7 and FIG. 8), and those of the terminal box of the Example 1 were considerably lower than those of the terminal box of the Comparative Example, and the difference thereof became much larger according as the passed electric current amount increased.

Also, a tendency similar to that of the Example 1 was seen in the Example 2 and in the Example 3 in which the kind of the Schottky barrier diode had been changed. As to the difference in the forward-direction voltage drop value VF, the difference in the generated heat amount, the difference in the diode junction temperature Tj, and the difference in the bottom surface temperature Tc of the terminal box from the terminal box of the Comparative Example using a PN diode, those of the Example 2 were smaller than those of the Example 1, and those of the Example 3 were smaller than those of the Example 2.

In particular, regarding the bottom surface temperature (Tc) of the terminal box, since the heat resistance temperature of the resin constituting the terminal box is typically about 120° C., it is extremely desirable that the Tc is equal to or lower than 120° C. in view of preventing the deformation of the resin to enhance the safety and the reliability of the terminal box. As will be understood from Table 3 and FIG. 8, in the terminal box of the Comparative Example, the bottom surface temperature (Tc) of the terminal box exceeds 120° C. under a passed electric current amount of 8.8 A and 11.0 A, and it is just a little below 120° C. even under a passed electric current amount of 6.0 A. In contrast, in the terminal boxes of the Example 1 and the Example 2, the bottom surface temperature (Tc) of the terminal boxes is far below 120° C. under any of the passed electric current amounts, so that one can say that the safety and the reliability of the terminal box are extremely high.

Also, in the terminal box of the Example 3 in which the kind of the Schottky barrier diode had been changed to a 110V rating type, the bottom surface temperature (Tc) of the terminal box exceeded 120° C. a little in the case in which the passed electric current amount was 11.0 A, whereas it was below 120° C. in the case in which the passed electric current amount was 6.0 A and 8.8 A. The passed electric current amount of 11.0 A is the test value on the standard, as described above, and is the passed electric current amount with an allowance of being 25% larger than the amount of electric current that flows through the diode under an actual circumstance of use. Therefore, one can say that even the terminal box of the Example 3 is, in actual cases, sufficiently usable for a current crystalline silicon solar cell panel.

From the above experiment results, it is clear that, according to the terminal boxes of the Examples 1 to 3 using a Schottky barrier diode as a bypass diode, the temperature rise of the diode and the terminal box can be effectively prevented, whereby the safety and the reliability of the terminal box can be enhanced.

INDUSTRIAL APPLICABILITY

According to the terminal box for a crystalline silicon solar cell panel of the present invention, the heat generation at the time of operation of the diode can be restrained, and the temperature rise of the diode and the terminal box can be effectively prevented, so that there is no fear of breakage of the diode or deformation of the terminal box. Therefore, the terminal box for a solar cell panel of the present invention can be suitably used in the field of terminal boxes for a solar cell panel that requires an extremely high safety and reliability over a long period of use (20 years or more).

The invention claimed is:

1. A terminal box for a crystalline silicon solar cell panel, wherein the terminal box comprises a bypass diode, and wherein the bypass diode is a Schottky barrier diode that has a junction temperature guarantee value of 150° C. or above, and the forward-direction voltage drop of the Schottky barrier diode when an electric current of 10 A is passed is 0.50 V or below at a junction temperature of 25° C., 0.40 V or below at a junction temperature of 100° C., and 0.35 V or below at a junction temperature of 150° C.

2. The terminal box for a solar cell panel according to claim 1, wherein the forward-direction voltage drop of the Schottky barrier diode when an electric current of 10 A is passed is 0.45 V or below at a junction temperature of 25° C., 0.35 V or below at a junction temperature of 100° C., and 0.30V or below at a junction temperature of 150° C.

3. The terminal box for a solar cell panel according to any of claim 1 or 2, wherein the terminal box is further equipped with a heat-dissipating plate for allowing the heat generated by the bypass diode to escape and/or an enlarged terminal plate for allowing the heat generated by the bypass diode to escape.

4. The terminal box for a solar cell panel according to claim 3, wherein the Schottky barrier diode is a surface-mounting type or non-insulation type package diode.

* * * * *

UNITED STATES PATENT AND TRADEMARK OFFICE
CERTIFICATE OF CORRECTION

PATENT NO.        : 7,928,315 B2
APPLICATION NO.   : 11/666373
DATED             : April 19, 2011
INVENTOR(S)       : Tsuyoshi Nagai and Jun Ishida It is certified that error appears in the above-identified patent and that said Letters Patent is hereby corrected as shown below:

Title Page, col. 2, Section (56), References Cited, Other Publications, "Photovotaic" should be --Photovoltaic--

Signed and Sealed this
Twenty-eighth Day of June, 2011

David J. Kappos
*Director of the United States Patent and Trademark Office*